(12) United States Patent
Hashimoto

(10) Patent No.: US 7,768,100 B2
(45) Date of Patent: Aug. 3, 2010

(54) SEMICONDUCTOR INTEGRATED CIRCUIT

(75) Inventor: Fuminori Hashimoto, Saitama (JP)

(73) Assignees: Sanyo Electric Co., Ltd., Moriguchi-shi (JP); Sanyo Semiconductor Co., Ltd., Gunma (JP)

( * ) Notice: Subject to any disclaimer, the term of this patent is extended or adjusted under 35 U.S.C. 154(b) by 284 days.

(21) Appl. No.: 12/119,099

(22) Filed: May 12, 2008

(65) Prior Publication Data

US 2008/0315344 A1   Dec. 25, 2008

(30) Foreign Application Priority Data

May 10, 2007   (JP)   ............................. 2007-125342

(51) Int. Cl.
    *H01L 23/60*   (2006.01)
(52) U.S. Cl. .................. 257/544; 257/491; 257/499; 257/509
(58) Field of Classification Search .................. 257/544
    See application file for complete search history.

(56) References Cited

U.S. PATENT DOCUMENTS

| | | | | |
|---|---|---|---|---|
| 5,432,368 | A * | 7/1995 | Jimenez ...................... | 257/355 |
| 5,559,352 | A * | 9/1996 | Hsue et al. .................. | 257/328 |
| 5,835,986 | A * | 11/1998 | Wei et al. .................... | 257/360 |
| 5,898,193 | A * | 4/1999 | Ham ........................... | 257/173 |
| 7,667,241 | B1 * | 2/2010 | Walker et al. ............... | 257/107 |
| 2003/0213971 | A1 * | 11/2003 | Yu .............................. | 257/119 |
| 2006/0223258 | A1 * | 10/2006 | Okushima ................... | 438/202 |
| 2007/0272942 | A1 * | 11/2007 | Otake ......................... | 257/139 |
| 2008/0197451 | A1 * | 8/2008 | Mollat et al. ................ | 257/544 |

FOREIGN PATENT DOCUMENTS

| | | |
|---|---|---|
| JP | 2003-264238 | 9/2003 |
| JP | 2005-057138 | 3/2005 |

* cited by examiner

*Primary Examiner*—Wael M Fahmy
*Assistant Examiner*—Abul Kalam
(74) *Attorney, Agent, or Firm*—Morrison & Foerster LLP

(57) ABSTRACT

This invention is directed to improve the electrostatic discharge strength and the latch-up strength of the semiconductor integrated circuit. To achieve the certain level of stable quality of the semiconductor integrated circuit by eliminating the variety in the electrostatic discharge strength and the latch-up strength is also aimed. The first NPN type bipolar transistor 3 and the second NPN type bipolar transistor 4 in the electrostatic discharge protection cell EC 1 are surrounded by the isolation region 6 made of the P+ type semiconductor layer and electronically isolated from other elements. The width WB1 of the isolating region 6 is larger than the width WB2 of the isolation region 7 that separates the elements comprising the internal circuit 50 from each other. This configuration can efficiently improve the electrostatic discharge strength and the latch-up strength. It is preferred that the width WB1 of the isolation region 6 is twice as large as the width WB2 of the isolation region 7 (usually, it is designed to minimize the size of the semiconductor integrated circuit) in order to efficiently improve the dielectric strength and the latch-up strength.

8 Claims, 6 Drawing Sheets

SEMICONDUCTOR INTEGRATED CIRCUIT

CROSS-REFERENCE OF THE INVENTION

This application claims priority from Japanese Patent Application No. 2007-125342, the content of which is incorporated herein by reference in its entirety.

BACKGROUND OF THE INVENTION

1. Field of the Invention

This invention relates to a semiconductor integrated circuit, especially to a semiconductor integrated circuit with an electrostatic discharge protection device.

2. Description of the Related Art

An electrostatic discharge protection device has been formed in a semiconductor integrated circuit of prior arts to protect an internal circuit from electrostatic discharge. A device with a bipolar transistor, a diode, or a MOS transistor is used as an electrostatic discharge protection device. The electrostatic discharge protection device is connected to a pad that is an electrode connected to an internal circuit receiving an external input signal or an electrode receiving an output signal from the internal circuit. When excessive noise pulse is applied to the pad, the electrostatic discharge protection device turns on letting an electric current with the noise pulse go to a power source line or a ground line for protecting the internal circuit. The semiconductor integrated circuit with the electrostatic discharge protection device is disclosed in Japanese Patent Application Publication Nos. 2003-264238 and 2005-057138.

However, the dielectric strength decreases in some pattern layouts of the semiconductor integrated circuit, further inviting problems such as latch-up and malfunction of the internal circuit due to the noise pulse applied to the pad.

SUMMARY OF THE INVENTION

The semiconductor integrated circuit of this invention has an internal circuit comprising a plurality of elements, a plurality of pads connected to the internal circuit receiving an input signal from outside or an output signal coming from the internal circuit, an electrostatic discharge protection device connected to the pad for protecting the internal circuit from electrostatic discharge, a first isolation region made of a semiconductor layer formed to surround the electrostatic discharge protection device, and a second isolation region made of a semiconductor layer separating a plurality of the devices that comprise the internal circuit from each other. The width of the first isolation region is wider than that of the second isolation region.

Since the width of the first isolation region that surrounds the electrostatic discharge protection device is large in this configuration, the electric current amplifying rate of a parasitic bipolar transistor, the base region of which is the first isolation region, is reduced. Therefore, the amount of the electric current going through the parasitic bipolar transistor when noise pulse is applied to the pad is reduced, improving the dielectric strength as well as the latch-up strength.

The first isolation region is grounded through a metal wiring in this configuration. Therefore, the base voltage of the parasitic bipolar transistor can be kept low. Since it is possible to release the base electric current to outside, the parasitic bipolar transistor is not turned on easily, improving the dielectric strength as well as the latch-up strength.

In addition to the configuration described above, an electrostatic discharge protection device cell is formed by combining the electrostatic discharge protection device and the first isolation region as one unit. Since a plurality of the electrostatic discharge protection cells are disposed to correspond to a plurality of the pads, the variation in the dielectric strength as well as the latch-up strength among pads can be reduced, achieving a stable quality of the semiconductor integrated circuit.

Accordingly, the dielectric strength and the latch-up strength of the semiconductor integrated circuit is improved. It is also possible to reduce the variation in the dielectric strength and the latch-up strength, achieving the stable quality of the semiconductor integrated circuit.

DETAILED DESCRIPTION OF THE INVENTION

Figure 1:
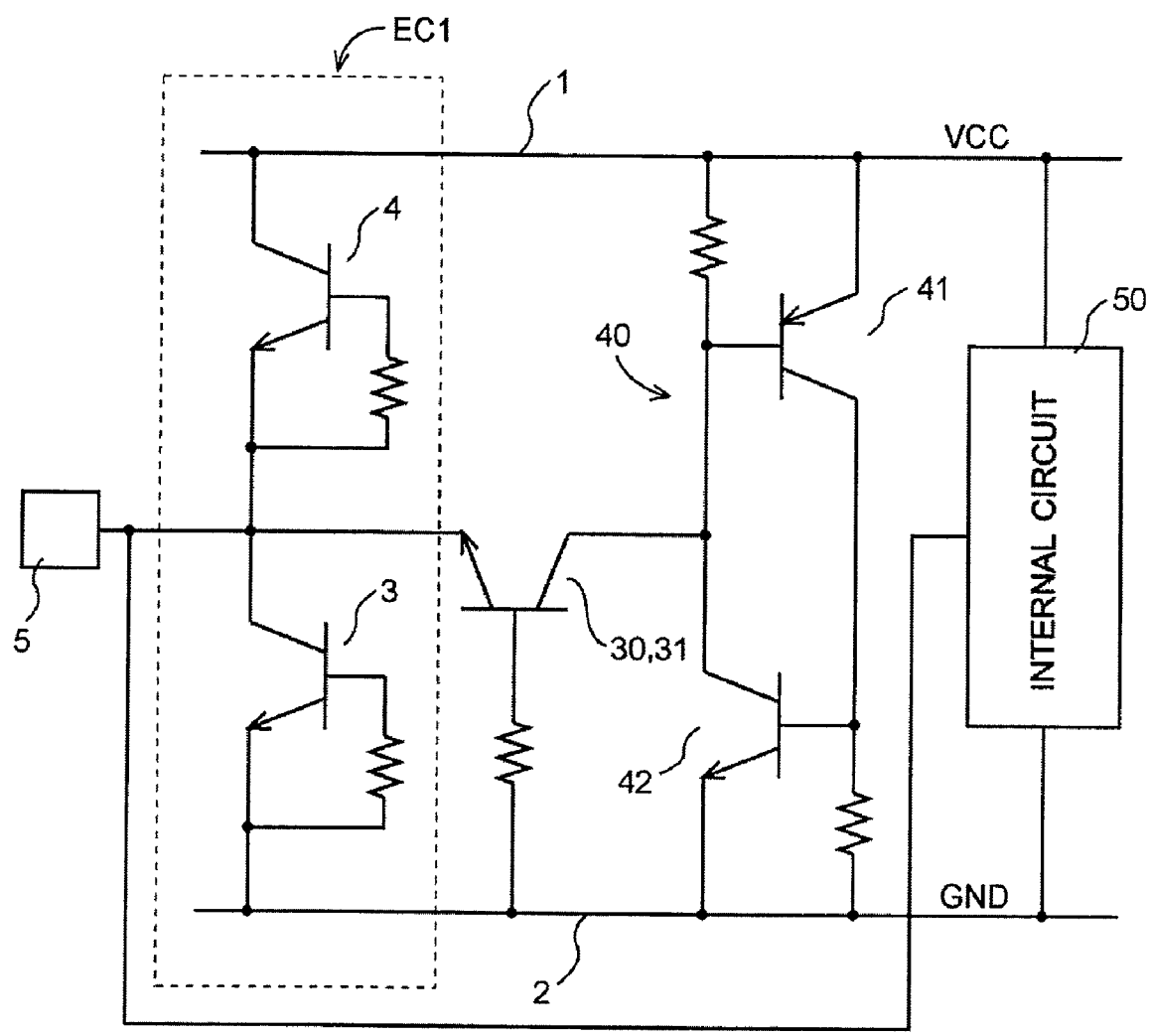
FIG. 1 is a circuit diagram of the electrostatic discharge protection cell and its peripheral area of the semiconductor integrated circuit of the first embodiment of this invention.
Figure 2:
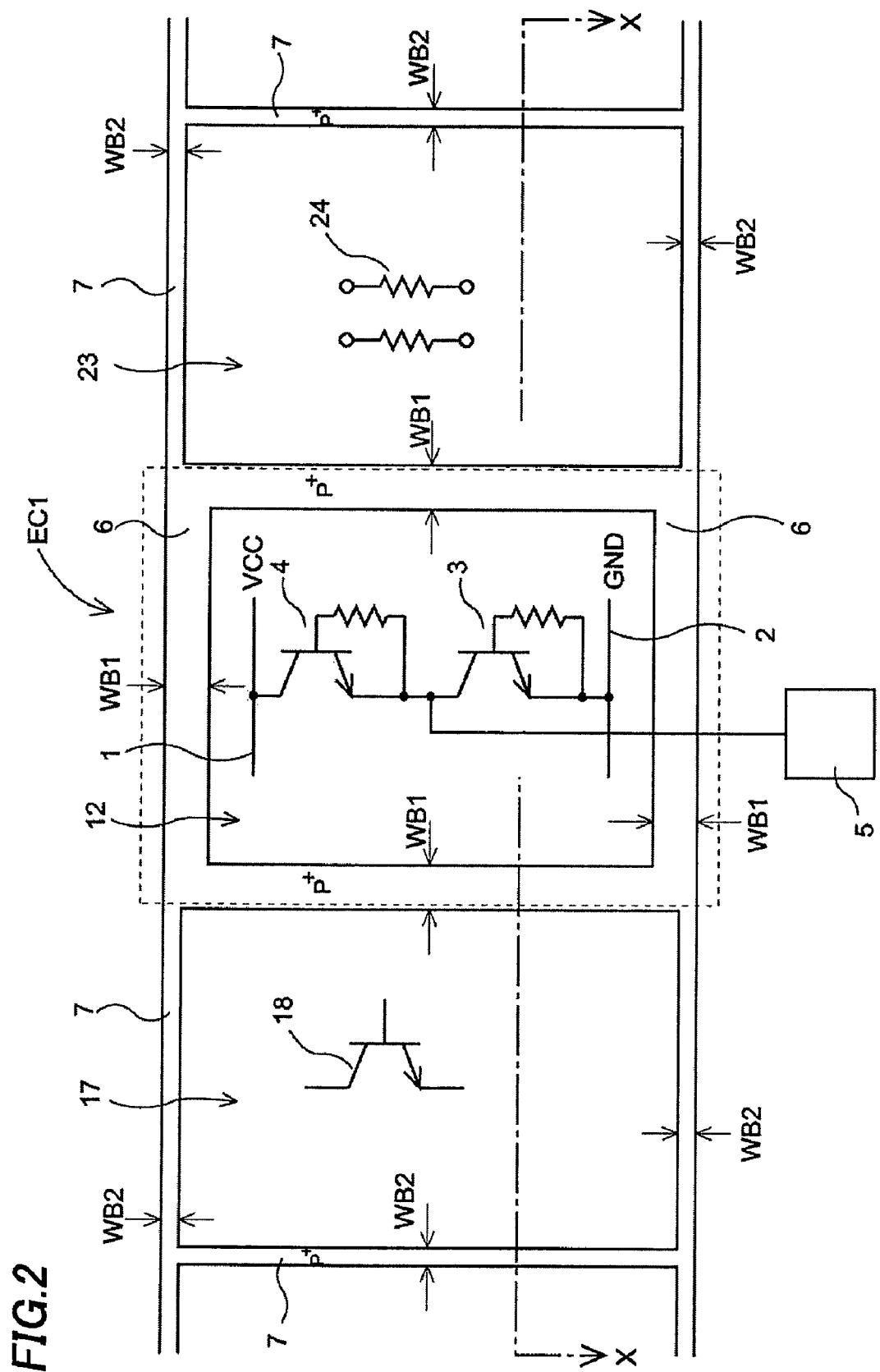
FIG. 2 is a pattern layout (a plan view) of the electrostatic discharge protection cell and its peripheral area of the semiconductor integrated circuit of the first embodiment of this invention.
Figure 3:
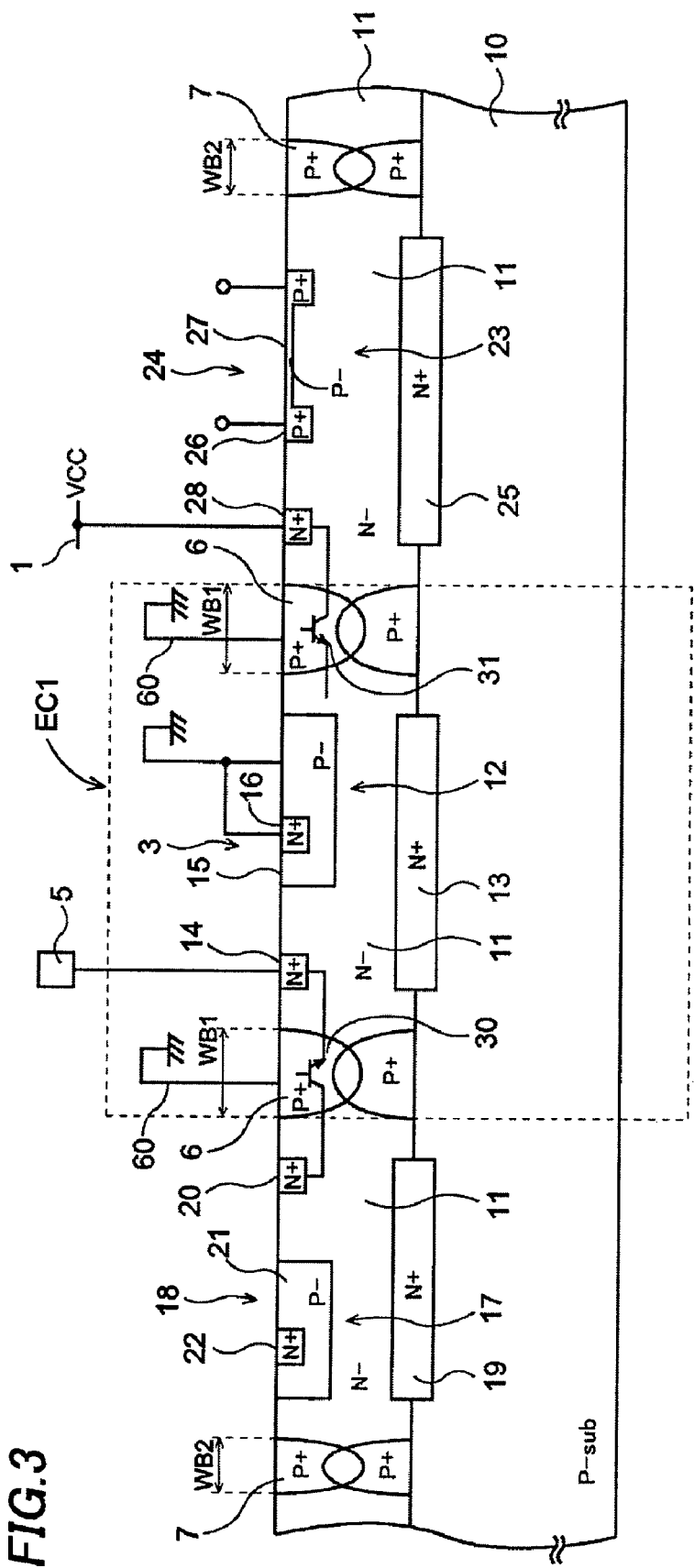
FIG. 3 is a cross-sectional view along with the X-X line in FIG. 2.

The semiconductor integrated circuit of a first embodiment of this invention will be explained first. FIG. 1 is a circuit diagram of one electrostatic discharge protection cell and its peripheral area of the semiconductor integrated circuit, and FIG. 2 is a simplified pattern layout (a plan view) of the electrostatic discharge protection cell and its peripheral area. FIG. 3 is a cross-sectional view along with the X-X line in FIG. 2.

An electrostatic discharge protection cell EC1 has a first NPN type bipolar transistor 3 and a second NPN type bipolar transistor 4 (one example of the electrostatic discharge protection device of this invention) that are connected in series between a power source line 1 supplying a power source potential VCC and a ground line 2 supplying a ground potential GND. The first and the second bipolar transistors 3 and 4 turn off in a usual state where noise pulse is not applied, because an emitter and a base of them are connected each other. A connection point of the bipolar transistors 3 and 4 is connected to a pad 5. The pad 5 is an electrode that is connected to an internal circuit 50 of a semiconductor integrated circuit. The pad 5 is an electrode that receives an input signal from outside and an output signal coming from the internal circuit 50. The power source line 1 and the ground line 2 are connected to the internal circuit 50. The internal circuit 50 may be an input circuit, an output circuit, an input and output circuit and other variety of circuits with variety of functions.

The first NPN type bipolar transistor 3 and the second NPN type bipolar transistor 4 are surrounded with an isolation region 6 (an example of a first isolation region of this invention) made of a P+ type semiconductor layer, electrically isolated from other devices. The width WB1 of the isolation region 6 is formed larger than a width WB2 of an isolation region 7 (an example of a second isolation region of this invention) that isolates individual devices of the internal circuit 50 from each other (WB1>WB2).

The configuration of the electrostatic discharge protection cell EC1 and its peripheral devices will be explained in detail by referring to FIGS. 2 and 3. Although the second NPN type bipolar transistor 4 of the electrostatic discharge protection cell EC1 is not shown in FIG. 3, it is surrounded with the isolation region 6 as the first NPN type bipolar transistor 3.

An N− type epitaxial semiconductor layer 11 is formed on a P− type semiconductor substrate 10. The epitaxial semiconductor layer 11 is divided into a plurality of island regions by the isolation regions 6 and 7. The isolation regions 6 and 7 are configured from two layers; a P+ type lower semiconductor layer that is diffused upward from the semiconductor substrate 10 beneath the epitaxial semiconductor layer 11 and a P+ type upper semiconductor layer that is diffused downward from the surface of the epitaxial semiconductor layer 11, and these two layers are overlapped each other (the configuration with an independent upper layer and an independent lower layer, with a part overlapping each other).

The first NPN type bipolar transistor 3 is formed in an island region 12 surrounded with the isolation region 6. An N+ type buried layer 13 is formed between the semiconductor substrate 10 and the epitaxial semiconductor layer 11, an N+ layer 14 and P− layer 15 are disposed on the surface of the epitaxial semiconductor layer 11, and an N+ layer 16 is formed in the P− layer 15 within the island region 12. The N− type epitaxial semiconductor layer 11 functions as a collector region, the P− layer 15 as a base region and the N+ layer 16 as an emitter region. The P− layer 15 (the base region) and the N+ layer 16 (the emitter region) are connected each other and both are grounded. An N+ layer 14 is a diffusion layer for connecting to the collector electrode, and the N+ layer 14 is connected to the pad 5 through the wiring.

A third NPN bipolar transistor 18 that is a part of the internal circuit 50 is formed in an island region 17 adjacent to the left side of the island region 12. The island region 17 is surrounded with the isolation regions 6 and 7. The third NPN type bipolar transistor 18 has the same configuration as that of the first NPN type bipolar transistor 3. That is, an N+ type buried layer 21 is formed between the semiconductor substrate 10 and the epitaxial semiconductor layer 11, an N+ layer 20 and P− layer 21 are disposed on the surface of the epitaxial semiconductor layer 11, and an N+ layer 22 is formed in the P− layer 21. The N− type epitaxial semiconductor layer 11 functions as a collector region, the P− layer 21 as a base region and the N+ layer 22 as an emitter region. Other devices (including a transistor, a resistance, and a diode) that configure the internal circuit 50 are formed in the other island region next to the island region 17 (not the island region 12). The island region is surrounded with the isolation region 7 with the width WB2.

A resistance element 24 that is a part of the internal circuit 50 is formed in an island region 23 adjacent to the right side of the island region 12. An N+ type buried layer 25 is formed also in the island region 23 between the semiconductor substrate 10 and the epitaxial semiconductor layer 11. The resistance element 24 includes a P+ layer 26 for connecting to an electrode formed on the surface of the epitaxial layer 11 and a P− layer 27 that is a resistance itself. Also, an N+ layer 28 is disposed on the surface of the epitaxial semiconductor layer 11. The epitaxial semiconductor layer 11 of the island region 23 is biased to the power source potential VCC by connecting the N+ layer 28 to the power source line 1. Other devices that configure the internal circuit 50 are formed in the other island region next to the island region 23 (not the island region 12). The island region is surrounded with the isolation region 7 with the width WB2.

NPN type parasitic bipolar transistors 30 and 31 are formed additionally to the configuration described above. The isolation region 6 that separate the island region 12 and the island region 17 functions as a base region, the N+ layer 20 and the N− type epitaxial semiconductor layer 11 in the island region 17 function as a collector region, and the N+ layer 14 and the N− type epitaxial semiconductor layer 11 in the island region 12 function as an emitter region in the parasitic bipolar transistor 30.

Also, the isolation region 6 that separate the island region 12 and the island region 23 functions as a base region, the N+ layer 28 and the N− type epitaxial semiconductor layer 11 in the island region 23 function as a collector region, and the N+ layer 14 and the N− type epitaxial semiconductor layer 11 in the island region 12 function as an emitter region in the parasitic bipolar transistor 31.

The first NPN type bipolar transistor 3 turns on, letting the electric current coming from the noise pulse go to the ground line 2 when the noise pulse of negative polarity is applied to the pad 5. However, if the parasitic bipolar transistors 30 and 31 are also turned on by the noise pulse, the electrostatic discharge strength will be decreased due to the surge electric current coming from the noise pulse. Additionally, a parasitic syristor 40, which is made of another parasitic bipolar transistor in the internal circuit, may be turned on by the surge electric current going through the parasitic bipolar transistors 30 and 31, possibly causing a malfunction of the internal circuit 50 due to latch-up (see FIG. 1).

The mechanism of latch-up will be explained hereinafter. The parasitic syristor 40 is configured from, for example, a PNP type bipolar transistor 41 and an NPN type bipolar transistor 42. The PNP type bipolar transistor 41 turns on when the base potential of the PNP type bipolar transistor 41 goes down because of the surge electric current going through the parasitic bipolar transistors 30 and 31. Then, the NPN bipolar transistor 42 turns on because the base potential of the NPN type bipolar transistor 42 go up due to the electric current between the collector and the emitter. When the NPN type bipolar transistor 42 turns on, the electric current between the collector and the emitter of the NPN type bipolar transistor 42 makes the base potential of the PNP type bipolar transistor 41 further go down and the electric current between the collector and the emitter of the PNP type bipolar transistor 41 increases. Therefore, the positive feedback is established in the parasitic syristor 40 and the electric current constantly goes through between the power source line 1 and the ground line 2.

Since the width WB1 of the isolation region 6 is larger than the width WB2 of the ordinary isolation region 7 in this embodiment, the current amplifying ratio of the parasitic bipolar transistors 30 and 31 can be kept low. Therefore, the electrostatic discharge strength and the latch-up strength can be improved. It is preferred that the width WB1 of the isolation region 6 is twice as large as the width WB2 of the isolation region 7 (usually, it is designed to minimize the size of the semiconductor integrated circuit) in order to efficiently improve the electrostatic discharge strength and the latch-up strength. Also, the width WB1 of the isolation region 6 should preferably larger than 3 μm.

Additionally, the isolation region 6 should be grounded through a metal wiring 60. The voltage of the parasitic bipolar transistors 30 and 31 can be kept low by doing so. Since the base electric current can escape easily to the ground through the metal wiring 60 having a low resistance, the parasitic bipolar transistors 30 and 31 do not easily turn on, further improving the electrostatic discharge strength and the latch-up strength.

It is also preferred to form one cell by combining the first and second NPN bipolar transistor 3 and 4 and the isolation region 6 when forming the electrostatic discharge protection cell EC1. Preferably, a plurality of the electrostatic discharge protection cells EC1 is arranged in such way that each cell is located corresponding to each of a plurality of the pads 5. A certain level of the electrostatic discharge strength and the latch-up strength can be obtained by using the electrostatic discharge protection cell EC1. That is, a certain level of stable quality of the semiconductor integrated circuit can be acquired by reducing the variety in the electrostatic discharge strength and the latch-up strength among the pads 5.

Figure 4:
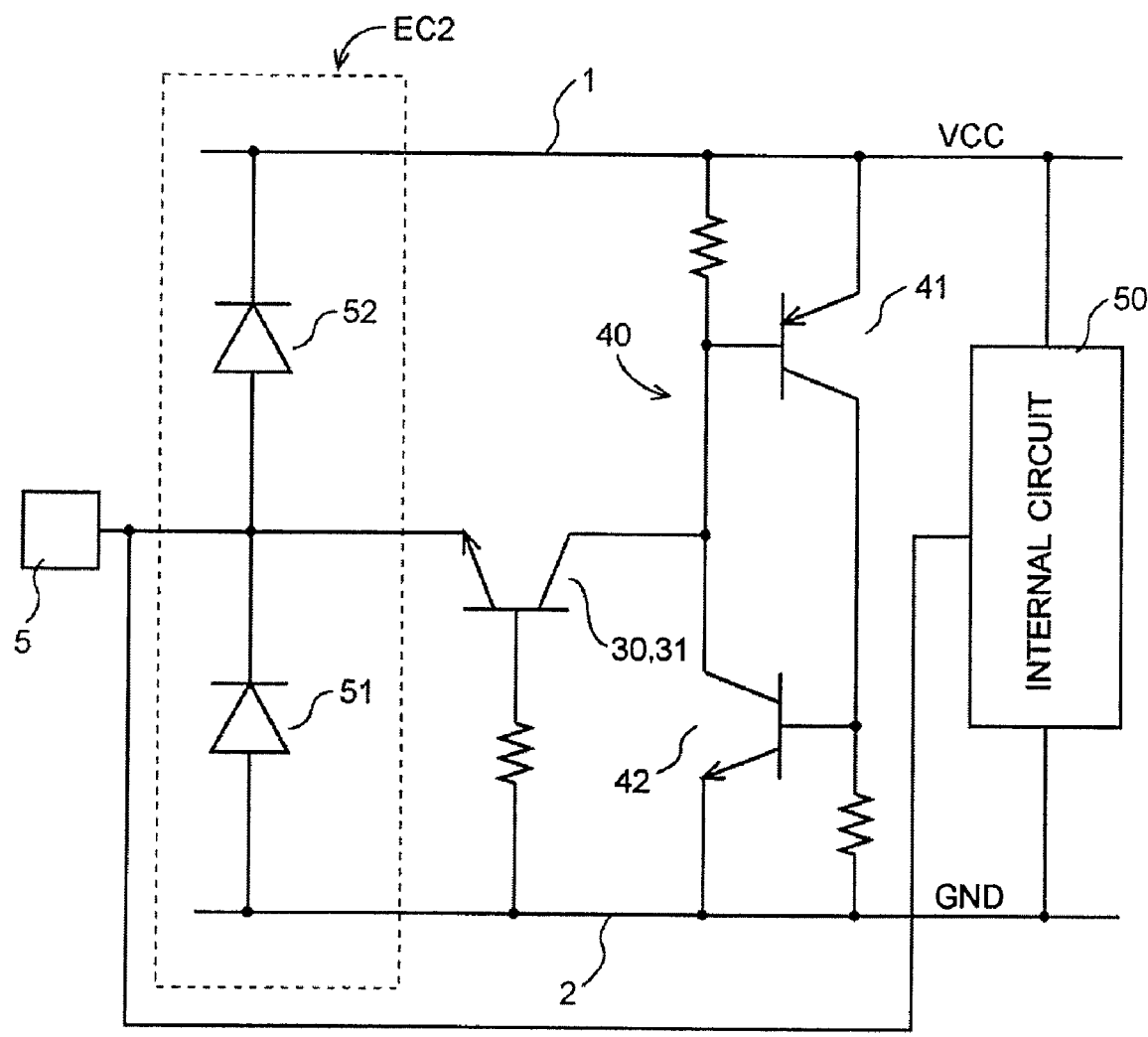
FIG. 4 is a circuit diagram of the electrostatic discharge protection cell and its peripheral area of the semiconductor integrated circuit of the second embodiment of this invention.
Figure 5:
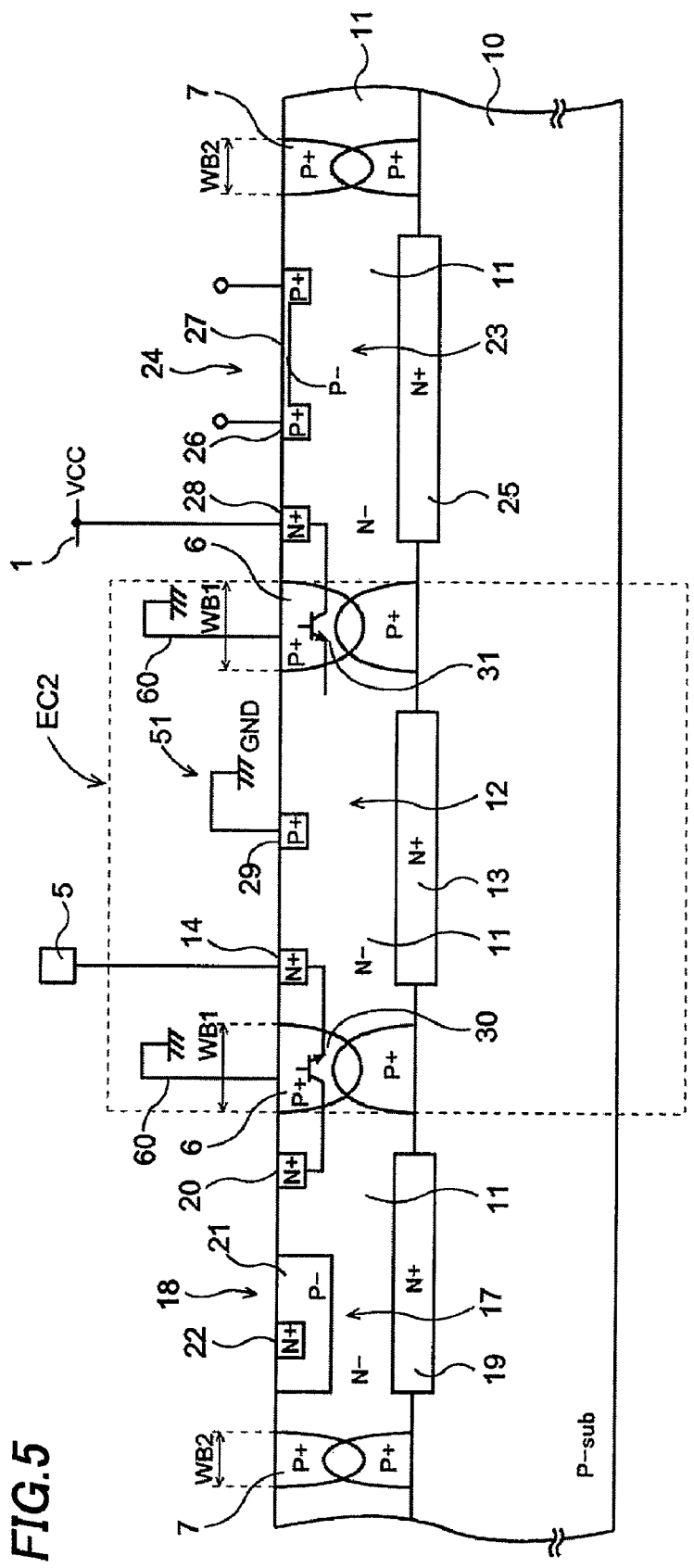
FIG. 5 is a cross-sectional view of the electrostatic discharge protection cell and its peripheral area of the semiconductor integrated circuit of the second embodiment of this invention.

Next, the semiconductor integrated circuit of a second embodiment of this invention will be explained. FIG. 4 is a circuit diagram of one electrostatic discharge protection cell and its peripheral area of the semiconductor integrated circuit. FIG. 5 is a cross-sectional view of the electrostatic discharge protection cell and its peripheral area. An electrostatic discharge protection cell EC2 of this embodiment has a first diode 51 and a second diode 52 that are connected in series between the power source line 1 supplying the power source potential VCC and the ground line 2 supplying the ground potential GND. The pad 5 is connected to the connecting points of the first diode 51 and the second diode 51. The first diode 51 and the second diode 52 are turned off in a usual state. However, the first diode 51 turns on when a noise pulse of negative polarity is applied to the pad 5, and the second diode 52 turns on when a noise pulse of positive polarity is applied to the pad 5, letting the electric current coming from the noise pulse go to either the power source line 1 or the ground line 2. Therefore, the destruction of the internal circuit 50 due to the electrostatic discharge is prevented.

The cross-sectional view of FIG. 5 only shows the first diode 51. The second diode 52 can be formed in the same manner. The N– type epitaxial semiconductor layer 11 in the island region 12 functions as a cathode, and the N+ layer connected to the pad 5 functions as a diffusion layer for connecting to the cathode electrode. Also, a P+ layer 29 formed on the surface of the N– type epitaxial semiconductor layer 11 functions as an anode of the first diode. Other configurations are the same as those in the first embodiment and they have the same effects as those in the first embodiment.

Figure 6:
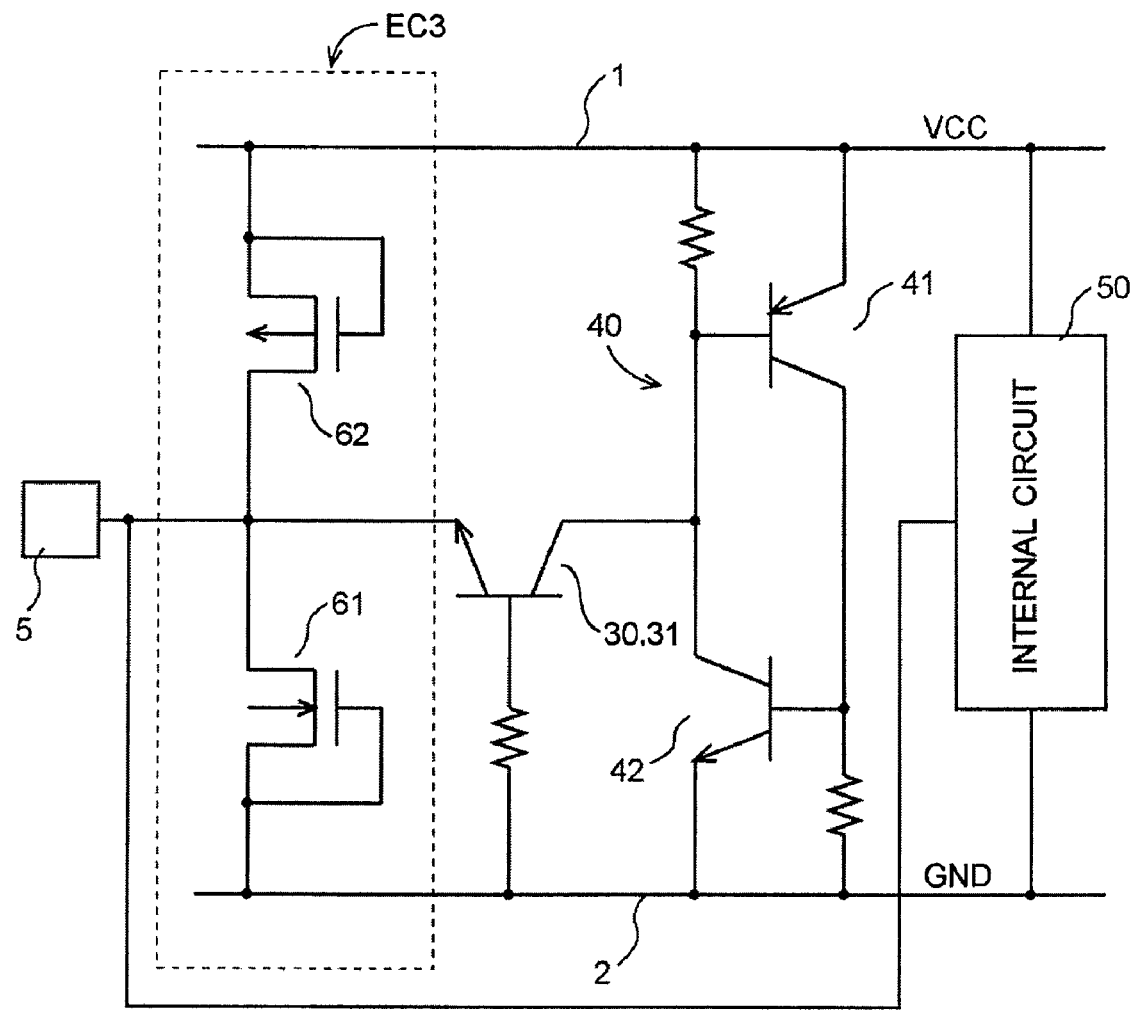
FIG. 6 is a circuit diagram of the electrostatic discharge protection cell and its peripheral area of the semiconductor integrated circuit of the third embodiment of this invention.

The semiconductor integrated circuit of a third embodiment of this invention will be explained hereinafter. FIG. 6 is a circuit diagram of one electrostatic discharge protection cell and its peripheral area of the semiconductor integrated circuit. An electrostatic discharge protection cell EC3 of this embodiment has a first MOS transistor 61 and a second MOS transistor 62 that are connected in series between the power source line 1 supplying the power source potential VCC and the ground line 2 supplying the ground potential GND. The pad 5 is connected to the connecting points of the first MOS transistor 61 and the second MOS transistor 62. The first MOS transistor 61 is N channel type and its source and gate, which are both connected to the ground line 2, are connected to each other. The second MOS transistor 62 is P channel type and its source and gate, which are both connected to the power source line 1, are connected to each other.

The first MOS transistor 61 and the second MOS transistor 62 are turned off in a usual state. However, the first MOST transistor 61 or the second MOS transistor 62 turns on when a noise pulse is applied to the pad 5, letting the electric current coming from the noise pulse go to either the power source line 1 or the ground line 2. Therefore, the destruction of the internal circuit 50 due to the electrostatic discharge is prevented. Other configurations are the same as those in the first embodiment and they have the same effects as those in the first embodiment.

Also, this invention is not limited to the embodiments described above. It can be altered within the scope of this invention. For example, the isolation regions 6 and 7 does not necessarily have the configuration with an independent upper layer and an independent lower layer as explained earlier in the first embodiment. The configuration, where a P+ type semiconductor layer reaches from the surface of the epitaxial semiconductor layer 11 to the semiconductor substrate 10, is also used. Also, the element configuring the electrostatic discharge protection device and the internal circuit is not limited to be an NPN type bipolar transistor. A PNP type bipolar transistor and other elements can also be employed.

What is claimed is:

1. The semiconductor integrated circuit comprising:
   a semiconductor layer;
   an internal circuit formed in the semiconductor layer and comprising a plurality of device elements;
   a pad connected to the internal circuit and receiving an input signal to the internal circuit or an output signal from the internal circuit;
   an electrostatic discharge protection device connected to the pad and formed in the semiconductor layer so as to protect the internal circuit from electrostatic discharge;
   a first isolation region formed in the semiconductor layer and surrounding the electrostatic discharge protection device; and
   a second isolation region formed in the semiconductor layer and separating the device elements from each other,
   wherein a width of the first isolation region is larger than a width of the second isolation region.

2. The semiconductor integrated circuit of claim 1, wherein the electrostatic discharge protection device is of a rectangular shape, and the first isolation region surrounds the electrostatic discharge protection device from all four sides of the electrostatic discharge protection device.

3. The semiconductor integrated circuit of claim 1, wherein the width of the first isolation region is twice as large as the width of the second isolation region.

4. The semiconductor integrated circuit of claim 1, wherein the first isolation region is grounded through a metal wiring.

5. The semiconductor integrated circuit of claim 1, wherein the electrostatic discharge protection device and the first isolation region are combined as one unit to form an electrostatic discharge protection cell, and the semiconductor integrated circuit comprises a plurality of the electrostatic discharge protection cells.

6. The semiconductor integrated circuit of claim 1, wherein the electrostatic discharge protection device comprises a bipolar transistor, a diode or a MOS transistor.

7. The semiconductor integrated circuit of claim 2, wherein the first isolation region has the same width on all four sides of the electrostatic discharge protection device.

8. The semiconductor integrated circuit of claim 7, wherein the same width is larger than 3 µm.

* * * * *